United States Patent
Yokogawa

(10) Patent No.: US 7,393,418 B2
(45) Date of Patent: Jul. 1, 2008

(54) SUSCEPTOR

(75) Inventor: Masanari Yokogawa, Niigata (JP)

(73) Assignee: Covalent Materials Corporation, Tokyo (JP)

(*) Notice: Subject to any disclaimer, the term of this patent is extended or adjusted under 35 U.S.C. 154(b) by 221 days.

(21) Appl. No.: 11/231,938

(22) Filed: Sep. 22, 2005

(65) Prior Publication Data

US 2006/0065196 A1    Mar. 30, 2006

(30) Foreign Application Priority Data

Sep. 29, 2004    (JP) .............................. 2004-285280

(51) Int. Cl.
*C23C 16/00* (2006.01)
*C23C 16/458* (2006.01)
*H01L 21/306* (2006.01)
*H01L 21/205* (2006.01)

(52) U.S. Cl. .................. 118/728; 118/500; 118/729; 118/730; 118/724; 118/725; 118/715; 156/345.51; 156/345.52; 156/345.53

(58) Field of Classification Search .............. 118/728; 156/345.51
See application file for complete search history.

(56) References Cited

U.S. PATENT DOCUMENTS

| 4,424,193 A | 1/1984 | Koyama et al. |
| 4,624,735 A | 11/1986 | Koyama et al. |
| 5,200,157 A * | 4/1993 | Toya et al. .................. 118/730 |
| 2004/0089236 A1 * | 5/2004 | Yokogawa et al. .......... 118/715 |

FOREIGN PATENT DOCUMENTS

| JP | 56-010921 A | 2/1981 |
| JP | 07-335572 | * 12/1995 |
| JP | 07-335572 A | 12/1995 |

* cited by examiner

*Primary Examiner*—Parviz Hassanzadeh
*Assistant Examiner*—Viji N Bernard
(74) *Attorney, Agent, or Firm*—Foley & Lardner LLP

(57) ABSTRACT

A susceptor at least a surface thereof being coated with SiC, includes a recess where an wafer is mounted, the recess having an round portion disposed on a lower portion of an outer circumferential portion of the recess, a ring-shaped SiC crystal growth surface portion provided within the round portion in a range of 0.05 mm or more and 0.3 mm or less defined from an outer circumference vertical portion of the recess and a contact portion, where the susceptor contacts with the wafer on the recess, having a surface roughness Ra in a range of 0.5 μm or more and 3 μm or less.

5 Claims, 4 Drawing Sheets

SUSCEPTOR

The present invention claims foreign priority to Japanese patent application No. 2004-285280, filed on Sep. 29, 2004 and No. 2004-085230, filed on Mar. 23, 2004, the contents of which are incorporated herein by references.

BACKGROUND OF THE INVENTION

1. Field of the Invention

The invention relates to a susceptor, in particular, a susceptor in which a SiC film formed on a wafer pocket is partially left without polishing so as to be a SiC grain growth surface portion.

2. Description of the Background Art

A semiconductor device is manufactured through many manufacturing processes. As susceptors that are used in an epitaxial growth process of a semiconductor wafer, because of the low reactivity and high strength, a SiC member in which SiC is coated on a carbon base material is frequently used.

There are a sheet-like susceptor in which a single wafer-housing recess is formed on a planar susceptor base material and a susceptor in which many recesses are formed on a planar susceptor base material.

The susceptor is manufactured by coating SiC on a carbon base material in which a recess is formed by means of the mechanical grinding or the like, followed by using as coated in the heat treatment or the like (refer to Japanese Patent Unexamined Publication No. JP-A-56-10921), or by further polishing the SiC coated surface by use of a polishing machine, followed by using in the heat treatment or the like (refer to Japanese Patent Unexamined Publication No. JP-A-7-335572).

However, in the susceptors manufactured according to the conventional manufacturing methods, when the susceptor is used as coated with a SiC film in the heat treatment like in the JP-A-56-10921, because SiC is very hard, when grains grow large, apexes of the grains work like a blade to cut a surface of a semiconductor wafer. Furthermore, when the coated surface is polished and used as shown in the JP-A-7-335572, stress is concentrated during the polishing process in the vicinity of a boundary portion between a bottom surface portion of the recess where a semiconductor wafer is mounted on and a vertical portion thereof to cause fine cracks in the film. Furthermore, in some cases, owing to the thermal stress during the heat treatment, with the fine crack as a starting point, cracks as shown in FIG. 6 are generated on the coated surface, resulting in a short lifetime.

Furthermore, when an entire surface of the recess where a wafer is placed is polished, in the recess, the wafer, owing to a gas remaining at a contact interface, is easy in sliding, and the gas tends to linger at a peripheral corner portion of the recess. Accordingly, there is a problem in that owing to a centrifugal force in association with a rotary motion of the susceptor and an influence of the gas, the wafer comes off the recess.

In order to overcome the problems, countermeasures such as disposing holes communicating to a susceptor bottom surface on a wafer contact surface of the recess or disposing grooves in lattice are adopted. However, in this case, there is a problem in that since a partial temperature difference is formed in the wafer surface, the wafer cannot be performed uniformly heat treatment.

Furthermore, in the conventional susceptors, an outer circumference planar portion continuing from the outer circumference portion of the recess where the wafer is placed is subjected to an ordinary CVD-SiC coating or to the mirror polishing. In the former one, a gas flow is disturbed at the outer circumference portion of a wafer mounting portion to deteriorate, for instance, the uniformity of a wafer epitaxial layer. Furthermore, when it is used repeatedly, in the outer circumference portion, it is highly likely that impurity components agglomerate to adversely affect on the wafer. In the latter case, since the gas flow in the outer circumference portion becomes excessively uniform to cause an abnormal growth protrusion in a deposition layer, for instance, on a downstream side of the gas, after the repetition use, the uniformity of the epitaxial layer of the wafer may be deteriorated.

SUMMARY OF THE INVENTION

The invention was carried out in view of the above situations and intends to provide a susceptor that does not cut a surface of a semiconductor wafer with an apex of a grain formed on a surface of SiC film, does not generate, even after the use for a long time, any cracks at a lower portion of an outer circumference portion of a recess to be long in the lifetime, can stably hold the wafer without coming off the recess, and can perform heat treatment on the surface of the wafer uniformly.

Furthermore, the invention intends to provide a susceptor that can homogenize an epitaxial layer of a wafer, and, even after the repetition use, does not agglomerate impurity components at an outer circumference portion of the recess to be free from adversely affecting on the wafer.

The inventors, after studying hard to achieve the abovementioned object, found that when, by paying attention to a fact that an outer circumference portion of a semiconductor wafer, in particular a silicon wafer, is necessarily subjected to beveling to chamfer the circumference of the wafer, and that a chamfered portion does not come into contact with a susceptor, a SiC grain growth surface portion is left without polishing on a site opposite to the chamfered portion of the susceptor, and fine cracks are not generated on the film surface of this portion. Thereby, the invention came to completion.

That is, in order to achieve the abovementioned objects, according to a first aspect of the present invention, there is provided a susceptor at least a surface thereof being coated with SiC, comprising a recess where an wafer is mounted, the recess including:

A round portion disposed on a lower portion of an outer circumferential portion of the recess;

a ring-shaped SiC crystal growth surface portion provided within the round portion in a range of 0.05 mm or more and 0.3 mm or less defined from an outer circumference vertical portion of the recess and a contact portion, where the susceptor contacts with the wafer on the recess, having a surface roughness Ra in a range of 0.5 µm or more and 3 µm or less. The surface roughness Ra (arithmetical mean roughness) is defined in Japanese industrial Standard (JIS) as JIS B 0601-1994.

According to the above configure, the susceptor that neither cuts the surface of the semiconductor wafer owing to the apex of the grain on the surface of SiC film nor, even after the use for a long period, generate any cracks at the lower portion of the outer circumference portion of the recess to achieve long lifetime, can be stably used without the wafer coming off the recess, and furthermore can perform heat treatment on a surface of the wafer uniformly can be realized.

According to a second aspect of the present invention, as set forth in the first aspect of the present invention, it is preferable that an outer circumference planar portion continuing from the outer circumferential portion of the recess and partially or wholly forms a surface of the susceptor is an irregular shape having an arithmetic average roughness Ra in a range of 0.05 µm or more and 0.5 µm or less.

According to a third aspect of the present invention, as set forth in the second aspect of the present invention, it is preferable that the susceptor comprises five recesses, and the outer circumference planar portion occupies 70% or more of the surface of the susceptor excluding the recesses.

According to a third aspect of the present invention, as set forth in the second aspect of the present invention, it is preferable that the susceptor comprises one recess, wherein the outer circumference planar portion covers whole of the surface of the susceptor excluding the recesses.

According to the susceptor of the invention, a susceptor that neither cuts a surface of the semiconductor wafer owing to an apex of the grain on a surface of a SiC film nor generate even after the use for a long period cracks at the lower portion of an outer circumference portion of the recess to achieve long lifetime, can be stably used without the wafer coming off the recess, and furthermore can perform heat treatment on a surface of the wafer uniformly can be provided.

Furthermore, the susceptor that can homogenize a wafer epitaxial layer, does not agglomerate impurity components in the outer circumference portion of the recess even after the repetition use and does not adversely affect on the wafer can be provided.

DETAILED DESCRIPTION OF THE PREFERRED EMBODIMENTS

Hereinafter, one embodiment of a susceptor according to the invention will be explained with reference to the accompanying drawings.

Figure 1:
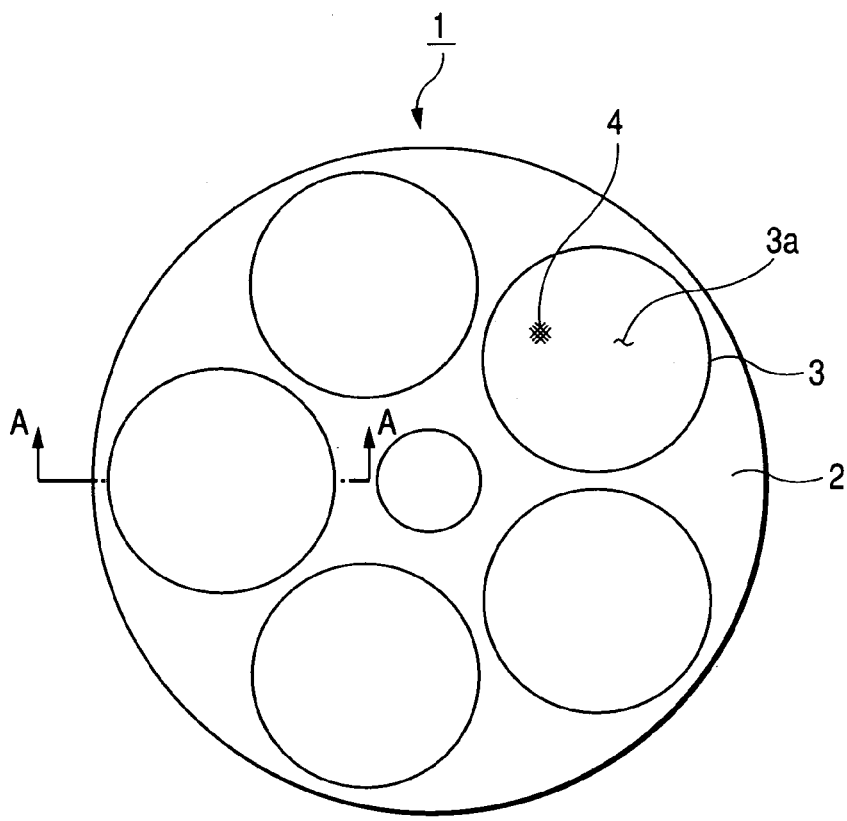
FIG. 1 is a plan view of a susceptor according to one embodiment of the invention.
Figure 2:
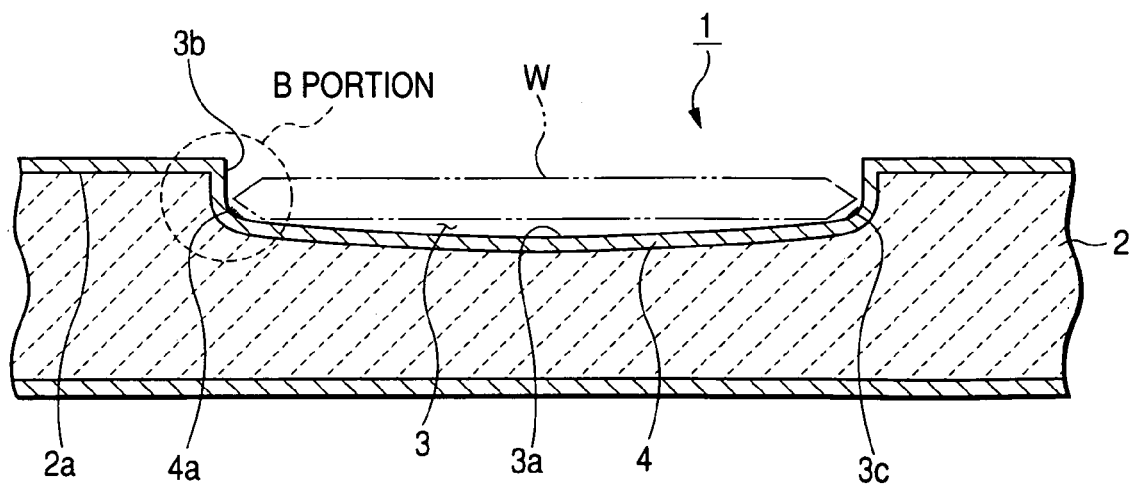
FIG. 2 is a sectional view along an A-A line in FIG. 1.
Figure 3:
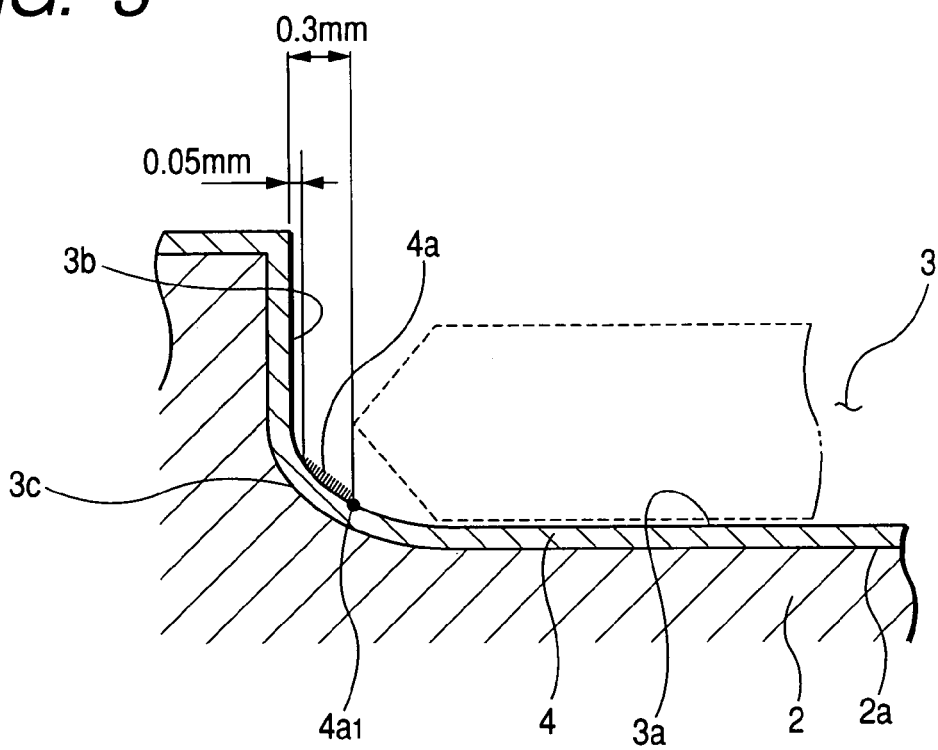
FIG. 3 is a sectional view showing by enlarging a B portion in FIG. 2.
Figure 4:
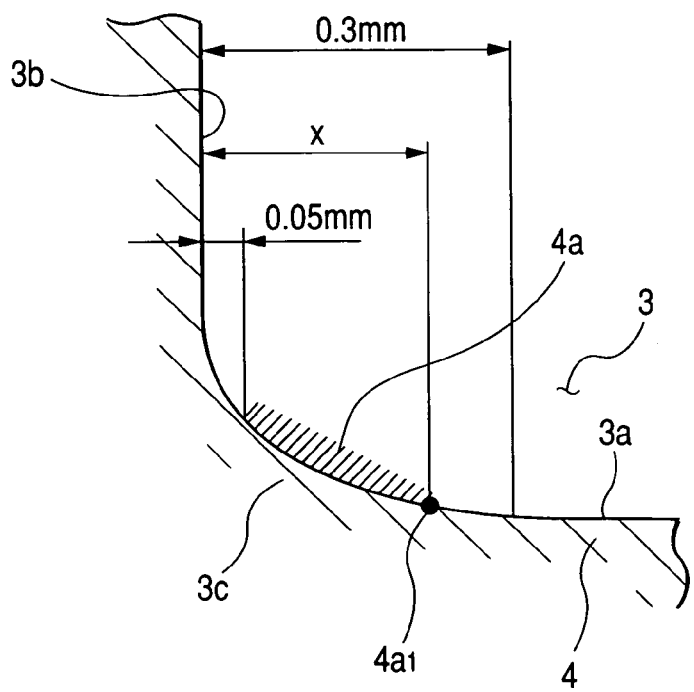
FIG. 4 is a sectional view showing by enlarging a B portion in FIG. 2.

FIG. 1 is a longitudinal sectional view of a susceptor according to the invention. FIG. 2 is a longitudinal sectional view showing a state of use thereof. FIGS. 3 and 4 are enlarged diagrams in the vicinity of a round portion that is shown by enlarging a B portion in FIG. 2.

As shown in FIG. 1, a susceptor 1 according to the invention has a structure in which a SiC film 4 is formed on a surface 2a of a carbon base material 2 and a plurality, for instance, five of recesses 3 each for mounting a semiconductor wafer is formed on the surface 2a of carbon base material 2.

As shown in FIG. 2, in the recess 3, a round portion 3c is formed between a wafer contact portion 3a where a wafer W is mounted and comes into contact therewith and an outer circumference vertical portion 3b that vertically rises up from the wafer contact portion 3a. As shown in FIGS. 3 and 4, a ring-like inner circumference edge $4a_1$ of a SiC grain growth surface portion 4a, which is just as formed by grain growth of SiC and without polishing, is formed so as to locate within the round portion 3c and in the range of 0.05 mm or more and 0.3 mm or less from the circumference vertical portion 3b of the recess 3. Surface roughness Ra (arithmetical surface roughness defined as JIS B 0601-1994) of a surface 3a, where the semiconductor wafer W comes into contact with the susceptor, is set in the range of 0.5 µm or more and 3 µm or less. That is, a distance x defined from the inner circumference edge $4a_1$ to the outer circumference vertical portion 3b is in the range of 0.05 to 0.3 mm measured from the outer circumference vertical portion 3b.

When the distance x from the outer circumference vertical portion is smaller than 0.05 mm, the stress relaxation effect is not exhibited. On the other hand, when it exceeds 0.3 mm, the grain growth surface portion comes into contact with a back surface of the wafer to be likely to damage the wafer. Furthermore, the Ra of the grain growth surface portion is preferable to be in the range of 5 µm or more and 10 µm or less. When the surface roughness Ra of the grain growth surface portion is smaller than 5 µm, there are many grain boundaries to be likely to cause cracks owing to the stress through grain boundaries. Furthermore, when the Ra exceeds 10 µm, the stress relaxation effect is large, and in the recess 3 an angle defined between a surface where the wafer is mounted and the outer circumference vertical portion is likely to be distorted.

A material of the base material may be optionally selected. However, when isostatic graphite is adopted, a desired shape can be easily obtained.

In the embodiment, since the semiconductor wafer does not come into contact with the outer circumference vertical portion 3b, the surface 3b may be left non-polished as a SiC grain growth surface.

In the next place, a manufacturing method of a susceptor according to the invention will be described.

Figure 5:
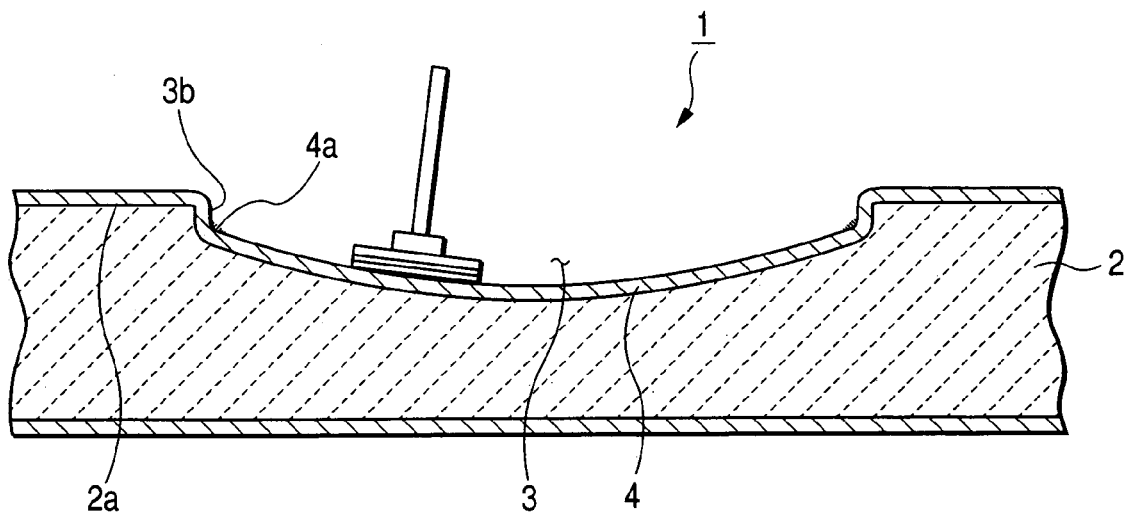
FIG. 5 is a conceptual diagram showing a manufacturing method of a susceptor according to one embodiment of the invention.
Figure 6:
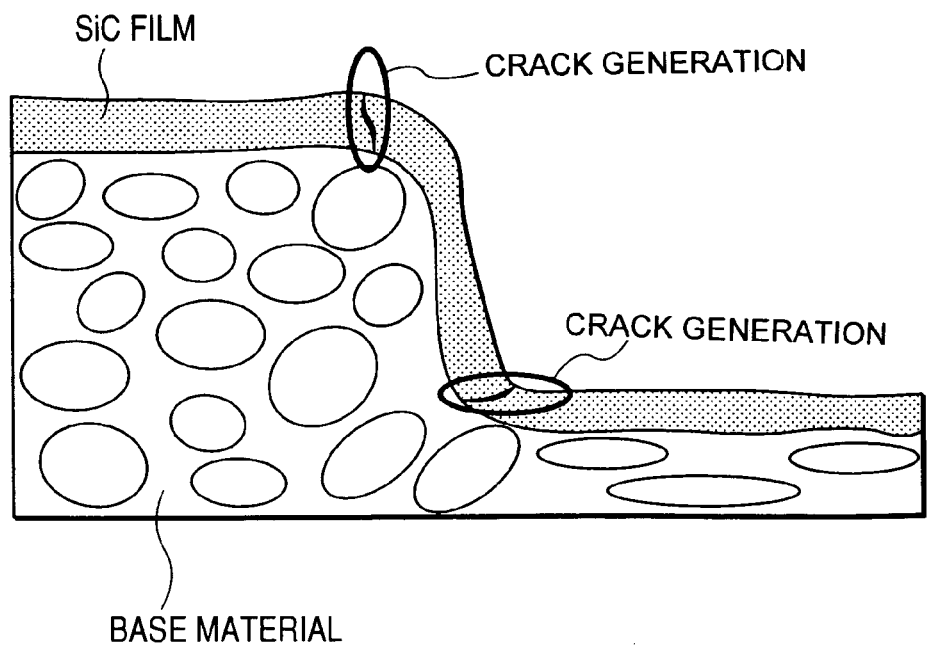
FIG. 6 is an explanatory diagram showing a crack occurrence state of an existing susceptor.

As shown in FIG. 5, a susceptor 1, in which a surface 2a of a carbon base material 2 provided with a recess 3 is coated with Sic film 4, is prepared. A wafer mounting surface 3a and an outer circumference vertical portion 3b are polished with a polishing machine 11 so that the respective surface roughness Ra becomes in the range of 0.5 µm or more and 0.3 µm or less. Furthermore, an round portion 3c is as well polished so that the surface roughness Ra thereof becomes in the range of 0.5 µm or more and 3 µm or less with remaining a non-polishing surface portion which is defined a range of 0.05 mm or more and 0.3 mm or less from the outer circumference vertical portion 3b. That is, the non-polishing surface portion of the round portion 3c is not polished so that the SiC grain growth surface portion 4a is remained. Accordingly, in the non-polished surface portion, which is the SiC grain growth surface portion 4a, any fine cracks are not generated due to the stress during polishing.

A heat treatment method of a semiconductor wafer with a susceptor according to the invention will be described.

As shown in FIGS. 2 and 3, a semiconductor wafer W is mounted on a wafer mounting surface 3a formed on the susceptor 1 which is disposed in a furnace, so that the semiconductor wafer W is housed in a recess 3.

At this time, the semiconductor wafer W, being beveled and provided with a chamfered portion c, does not come into contact with the SiC grain growth surface portion 4a of the round portion 3c.

Thereafter, a raw material gas is supplied in the furnace, and the susceptor 1 and the semiconductor wafer W are heated to apply heat treatment to the semiconductor wafer W.

In such a heat treatment process, the susceptor 1 is provided with the round portion 3c at a lower portion of the outer circumference portion of the recess 3 on which the wafer W is mounted, a ring-like SiC grain growth surface portion (that is not polished and is not flat) within the round portion 3c and at least in the range of 0.05 mm or more and 0.3 mm or less from the outer circumference vertical portion of the recess portion 3, and appropriate irregularities owing to SiC grains in the outer circumference portion. Accordingly, without causing such a problem as that a gas lingers at an outer circumference corner portion of the recess 3 and resultantly the wafer W comes off the recess 3, the susceptor 1 can be stably used. Furthermore, a contact portion with the wafer W in the recess 3 is formed in a uniform surface with the surface roughness Ra in the range of 0.5 μm or more and 3 μm or less (there is neither communicated holes nor lattice-like grooves). Accordingly, the wafer W can be performed heat treatment uniformly in a plane thereof.

Since the wafer-mounting surface 3a, with which the semiconductor wafer W comes into contact, is polished so that the surface roughness Ra is 0.5 μm or more and 3 μm or less, the wafer-mounting surface 3a of the susceptor does not cut a surface of the semiconductor wafer. Furthermore, since a ring-like inner circumference edge $4a_1$ of the non-polished SiC grain growth surface portion 4a is formed so as to locate within the round portion and in the range of 0.05 mm or more and 0.3 mm or less from the outer circumference vertical portion of the recess 3, any fine cracks owing to the polishing are not caused on the SiC grain growth surface portion 4a and cracks starting from the fine cracks owing to the thermal stress during the heat-treatment are not generated on a film surface.

As mentioned above, according to the embodiment, a surface of the semiconductor wafer is not cut with apexes of grains on a SiC film surface. Even after the longer period use, any cracks are not generated in the lower portion of the outer circumference portion of the recess on which the wafer is mounted. Accordingly, the susceptor can be used for a long time. Furthermore, the wafer can be stably used without coming off the recess and uniform heating can be applied to the wafer surface.

According to the embodiment, an example where a plurality of wafer-mounting recesses is disposed on a base material is exemplified. However, even when the susceptor according to the invention is a sheet type susceptor in which one recess is formed on a base material, similar advantages can be obtained.

Another embodiment of a susceptor according to the invention will be described.

According to the embodiment, in the embodiment shown in FIG. 2, a susceptor is restricted in the range of the surface roughness of an outer circumference planar portion continuing from an outer circumference portion of the recess.

Figure 7:
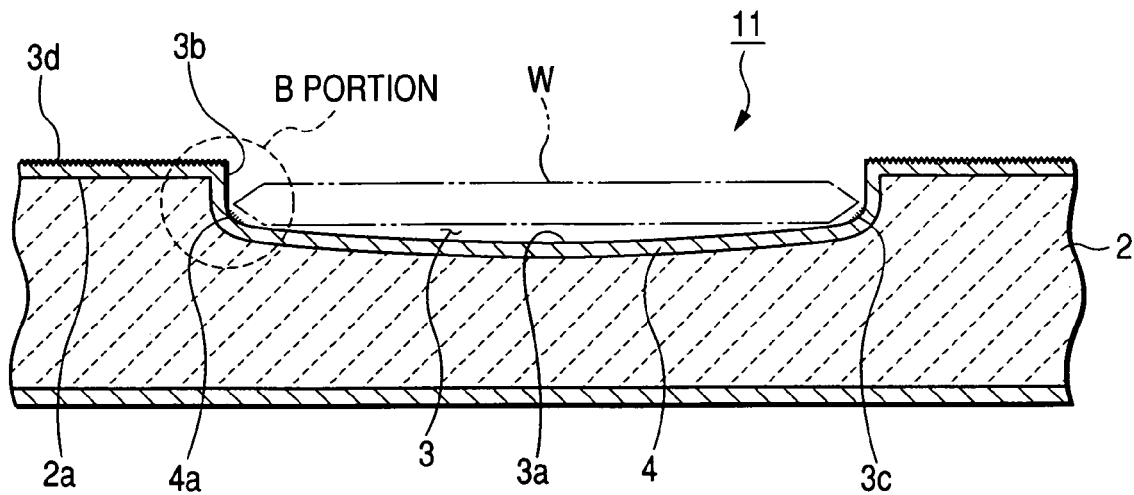
FIG. 7 is a sectional view of a susceptor according to another embodiment of the invention.

For instance, as shown in FIG. 7, a susceptor 11 according to the embodiment is provided with an outer circumference planar portion 3d that forms a part or an entirety of a surface of the susceptor 11 continuing from the outer circumference portion of the recess 3, the outer circumference planar portion 3d forming an irregular shape having the arithmetic average roughness Ra (which is defined in JIS B0601-1994) in the range of 0.05 μm or more and 0.5 μm or less.

Figure 8:
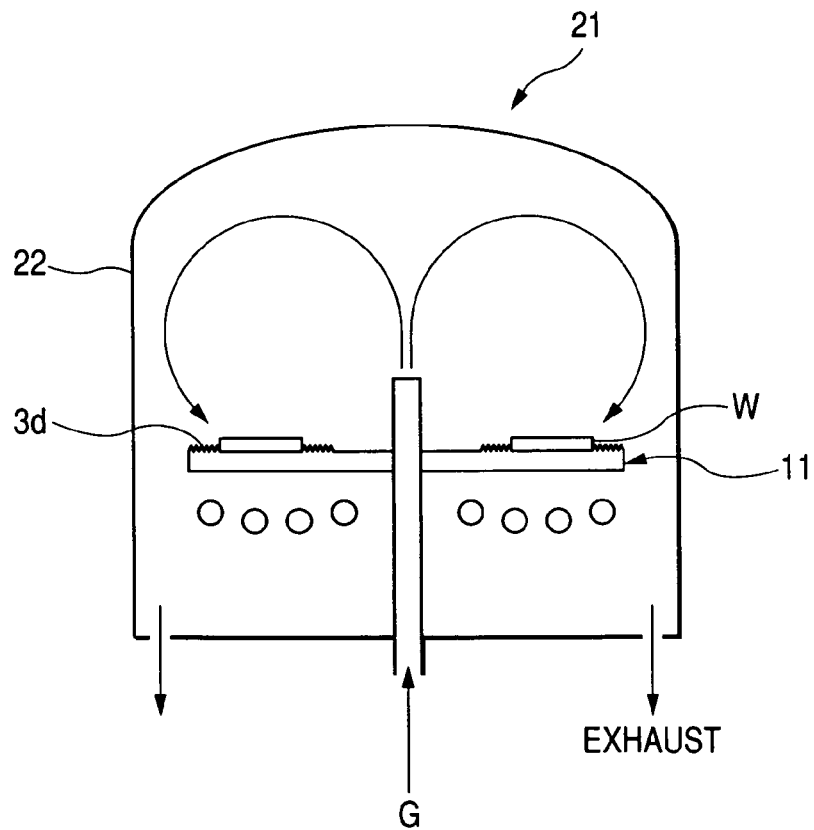
FIG. 8 is a conceptual diagram showing a state of use of a susceptor according to another embodiment of the invention.

Accordingly, as shown in FIG. 8, for instance in an epitaxial growth process, a raw material gas, which is supplied in a bell jar 22 of an epitaxial device 21, reaches an outer circumference planar portion 3d. Successively, the raw material gas flows through concaved portions of the outer circumference planar portion 3d, which is defined between projected portions in appropriate irregular shape of the outer circumference planar portion 3d. Accordingly, the flow of the raw material is rectified throughout the concaved portions. Furthermore, impurities contained in the raw material gas flow are agglomerated and deposited at the concaved portions. Accordingly, since there is no turbulence in a raw material gas flow flowing over the wafer, a uniform epitaxial layer can be formed. Furthermore, even after the long period use, an epitaxial layer is inhibited from being mingled with impurities and failure owing to the impurities can be reduced.

When the surface roughness of the outer circumference planar portion is 0.5 μm or more, the rectification effect is deteriorated. On the other hand, when the surface roughness is 0.05 μm or less, the gas flow on the outer circumference planar portion is excessively homogenized to form an abnormal growth projection on a downstream side of the gas flow, that is, on a recess side of the outer circumference planar portion, resulting in deteriorating the uniformity of an epitaxial layer of the wafer after repeated use.

The outer circumference planar portion, in such a susceptor where five recesses are formed on a base material as shown in the embodiment, preferably occupies 70% or more of a surface of the base material excluding the recesses. When it exceeds 70%, the gas flow can be remarkably rectified. Furthermore, in the case of a sheet type susceptor where one recess is formed on the base material, the outer circumference planar portion preferably occupies an entire surface.

Furthermore, in the case of a base material including the outer circumference planar portion formed around the recess being structurally difficult to manufacture or assemble integrally with the recess, or, in the case of the recess and the base material being different in the lifetime, even when the base material and the recess are manufactured partially or entirely separately, the invention can exhibit the identical effect.

Since other configurations are not different from that of the susceptor shown in FIG. 2, these are designated with the same reference numerals and descriptions thereof are omitted here.

EXAMPLES

[Experiment 1]

Example 1

An isostatic carbon base material machined into a susceptor shape having one recess was coated with SiC having surface roughness Ra of 7.2 μm. A mounting surface of the recess excluding an area, which is defined 0.3 mm from an outer circumference side thereof as a non-polished portion was ground and polished with a rotary polishing machine with diamond abrasive grains of #500 or less to prepare a susceptor.

Example 2

A susceptor was prepared in a similar manner to example 1 except that the non-polished portion on the outer circumference side of the recess was set at 0.05 mm.

Example 3

A susceptor was prepared in a similar manner to example 1 except that abrasive grains of the rotary polishing machine were set at #40 or less.

Example 4

A susceptor was prepared in a similar manner to example 2 except that abrasive grains were set at #40 or less.

Comparative Example 1

A susceptor was prepared in similar manner to example 1 except that a non-polished portion on the outer circumference side of the recess was set up to 0.4 mm.

Comparative Example 2

A susceptor was prepared in a similar manner to example 3 except that a non-polished portion on the outer circumference side of the recess was set up to 0.4 mm.

Comparative Example 3

A susceptor was prepared in a similar manner to example 1 except that abrasive grains of the rotary polishing machine were set at #800 or less.

Comparative Example 4

A susceptor was prepared in a similar manner to example 2 except that abrasive grains of the rotary polishing machine were set at #800 or less.

The surface roughness of the respective examples and comparative examples was measured. Furthermore, each of these was installed in an epitaxial growth device followed by processing 100 silicon wafers. After the processing, the number of wafers of which back surface was bruised was checked and cracks in the recess after the use were also checked.

Results are shown in Table 1.

TABLE 1

| Sample | Width of grain growth surface (mm) | Ra of polished surface (μm) | Number of occurrence of bruise (sheet) | Cracks in recess |
|---|---|---|---|---|
| Example 1 | 0.3 | 0.5 | 0 | None |
| Example 2 | 0.05 | 0.5 | 0 | None |
| Example 3 | 0.3 | 3 | 0 | None |
| Example 4 | 0.05 | 3 | 0 | None |
| Comparative example 1 | 0.4 | 0.5 | 12 | None |
| Comparative example 2 | 0.4 | 3 | 42 | None |
| Comparative example 3 | 0.3 | 0.3 | 11 (fused) | None |
| Comparative example 4 | 0.05 | 0.3 | 16 (fused) | None |

As obvious from Table 1 as well, examples 1 through 4 each where the width of the grain growth surface and the Ra of the polished surface are within the ranges of the invention are all free from the bruise on the wafer and the crack in the recess.

To the contrary, in comparative example 1 where the width of the grain growth surface is outside of the upper limit and the Ra of the polished surface is within the lower limit, the bruise was found in 12 wafers and the crack in the recess was not found.

In comparative example 2 where the width of the grain growth surface is outside of the upper limit and the Ra of the polished surface is within the upper limit, the bruise was found in 42 wafers and the crack in the recess was not found.

In comparative example 3 where the width of the grain growth surface is within the lower limit and the Ra of the polished surface is outside of the lower limit, the bruise was found in 11 wafers, fusing occurred between the wafer and the wafer mounting surface, and the crack in the recess was not found.

In comparative example 4 where the width of the grain growth surface is within the lower limit and the Ra of the polished surface is outside of the lower limit, the bruise was found in 16 wafers, fusing occurred between the wafer and the wafer mounting surface, and the crack in the recess was not found.

[Experiment 2]

SiC was coated according to a known method on isostatic carbon that was machine-processed into a susceptor shape with a recess and a planar outer circumference planar portion in an outer circumference of the recess, followed by grinding and polishing the outer circumference planar portion to variously finish. As shown in Table 2, the surface roughness of the outer circumference planar portion and the area ratio of the outer circumference planar portion to a surface area of a base material excluding the recess were varied to prepare examples 5 through 9 and comparative examples 5 and 6.

With each of the susceptors according to examples 5 through 9 and comparative examples 5 and 6, one hundred silicon wafers were subjected to the epitaxial growth process, followed by evaluating the uniformity of the epitaxial layer and the impurity concentration.

TABLE 2

| Sample | Surface roughness of outer circumference planar portion Ra (μm) | Area ratio of outer circumference planar portion (%) | Occurrence of irregularity failure (sheet/100 sheets) | Occurrence of impurity failure (sheet/100 sheets) |
|---|---|---|---|---|
| Example 5 | 0.06 | 85 | 1 | 0 |
| Example 6 | 0.21 | 85 | 0 | 0 |
| Example 7 | 0.46 | 85 | 3 | 0 |
| Example 8 | 0.21 | 72 | 0 | 3 |
| Example 9 | 0.21 | 94 | 0 | 2 |
| Comparative example 5 | 0.03 | 85 | 12 | 0 |
| Comparative example 6 | 0.54 | 85 | 18 | 8 |

As obvious also from Table 2, examples 5 through 9 of which surface roughness Ra of the outer circumference planar portion is within the range of the invention are all less in the occurrence of the uniformity failure and the impurity failure. On contrary, comparative examples 5 and 6 of which surface roughness Ra is outside of the range of the invention are all abundant in the occurrence of the uniformity failure, and comparative example 6 is also abundant in the impurity failure.

While there has been described in connection with the preferred embodiments of the present invention, it will be obvious to those skilled in the art that various changes and modification may be made therein without departing from the present invention, and it is aimed, therefore, to cover in the appended claim all such changes and modifications as fall within the true spirit and scope of the present invention.

What is claimed is:

1. A susceptor for use in growing semiconductor wafers, comprising:
    a base which comprises
    at least one surface, comprising a recess formed in the coated surface for mounting a wafer the recess comprising a generally flat floor region defining a contact portion for the wafer, an outer circumferential vertical portion, and a rounded transitional portion providing a transition between a lower portion of the outer circumferential vertical portion of the recess and the generally flat floor region of the recess;
    a layer of SiC coating the surface and the recess; a second ring-shaped SiC crystal growth surface portion provided within the rounded transitional portion located at a distance within a range of 0.05 mm to 0.3 mm less defined from the outer circumference vertical portion of the recess and
    wherein a surface roughness Ra in the contact portion, where the susceptor contacts the wafer is within on the recess, having a surface roughness Ra in a range of 0.5 µm 3 µm less.

2. The susceptor according to claim 1, wherein an outer circumference planar portion extending from the outer circumferential vertical portion of the recess and at least partially or forming a surface of the susceptor has an irregularly shaped surface having an arithmetic average roughness Ra in a range of 0.05 µm to 0.5 µm.

3. The susceptor according to claim 2, comprising five recesses, wherein the outer circumference planar portion occupies 70% or more of the surface of the susceptor excluding the recesses.

4. The susceptor according to claim 2, comprising one recess, wherein the outer circumference planar portion covers the entire surface of the susceptor excluding the recesses.

5. The susceptor according to claim 1, wherein the second ring-shaped SiC crystal growth layer comprises a non-polished surface portion.

* * * * *